United States Patent [19]

Adkins

[11] Patent Number: 5,532,653
[45] Date of Patent: Jul. 2, 1996

[54] SUPPLY VOLTAGE COMPENSATED CHARGE PUMP OSCILLATOR

[75] Inventor: Kenneth C. Adkins, Fremont, Calif.

[73] Assignee: National Semiconductor Corporation, Santa Clara, Calif.

[21] Appl. No.: 384,980

[22] Filed: Feb. 7, 1995

[51] Int. Cl.[6] .............................. H03B 5/04; H03B 5/06; H03B 5/24; H03K 3/011
[52] U.S. Cl. .......................... 331/143; 331/75; 331/175; 331/173; 327/534; 327/537
[58] Field of Search ................................. 331/57, 74, 75, 331/78, 111, 113 R, 108 C, 143, 144, 175, 173; 327/534–537

[56] References Cited

U.S. PATENT DOCUMENTS

| 4,631,421 | 12/1986 | Inoue et al. ........................ 327/537 X |
| 4,849,717 | 7/1989 | Fitzpatrick et al. .................... 331/111 |
| 5,036,229 | 7/1991 | Tran ......................................... 307/497 |

OTHER PUBLICATIONS

John F. Dickson, "*On–Chip High–Voltage Generation in MNOS Integrated Circuits Using an Improved Voltage Multiplier Technoque*", IEEE Journal of Solid–State Circuits, vol. SC–11, No. 3, Jun. 1976, pp. 374–378.

*Primary Examiner*—David Mis
*Attorney, Agent, or Firm*—Skjerven, Morrill, MacPherson, Franklin & Friel; Stephen A. Terrile

[57] ABSTRACT

A charge pump oscillator for regulating an oscillator frequency over a wide range of supply voltages is disclosed. Such a charge pump oscillator provides a charge pump system that provides a consistent current output over a range of supply voltages. The charge pump oscillator includes a reference circuit, a timing circuit, a latch circuit and a driver circuit.

18 Claims, 3 Drawing Sheets

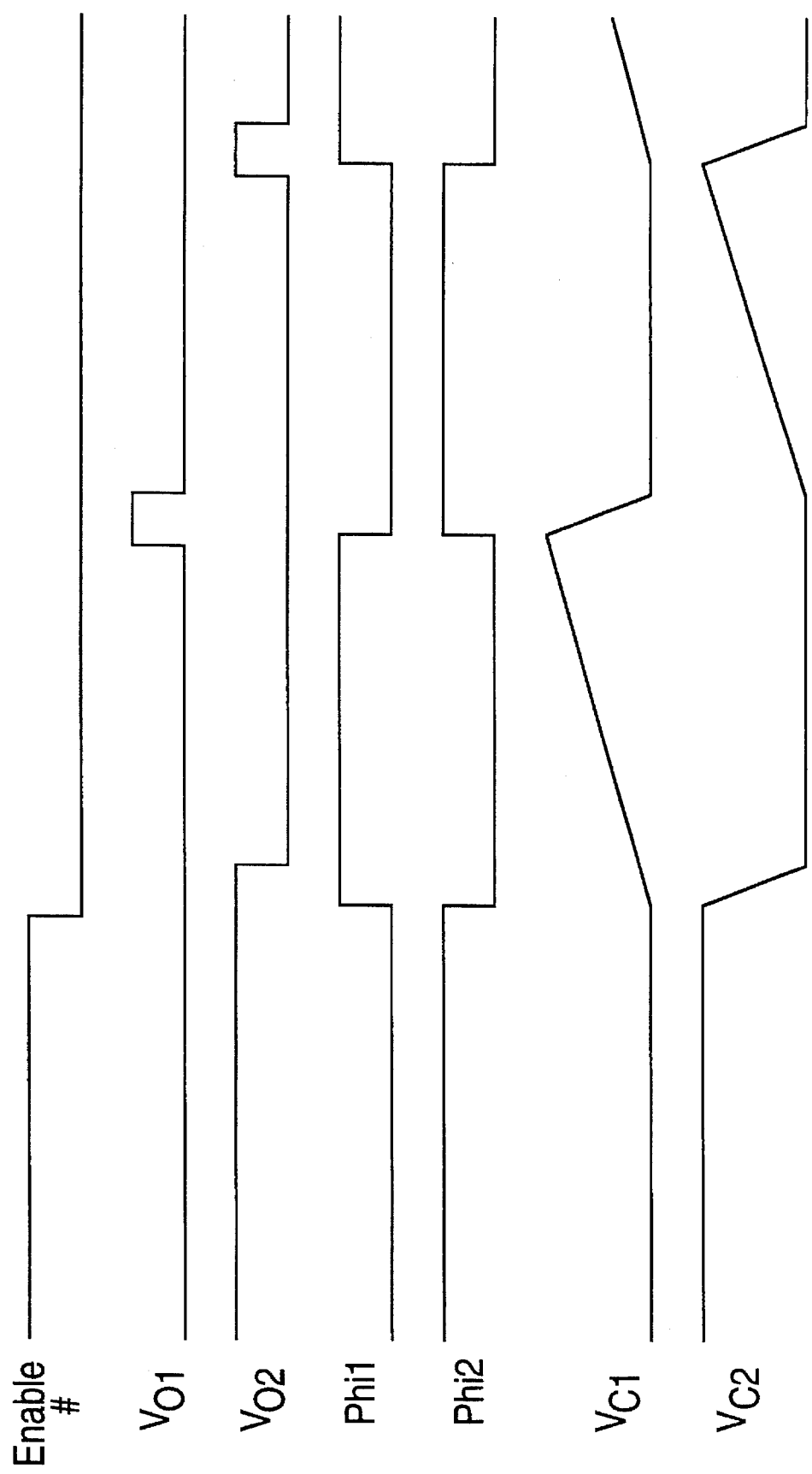

5,532,653

1

SUPPLY VOLTAGE COMPENSATED CHARGE PUMP OSCILLATOR

BACKGROUND OF THE INVENTION

The present invention relates to charge pump system and more particularly, to charge pump oscillators for use in charge pump systems.

Charge pump systems are used by many non-volatile memory devices such as electrically erasable programmable read only memories (EEPROM's) to generate the high internal programming voltages necessary to achieve electron tunneling. The combination of a charge pump circuit and a charge pump oscillator provides the charge pump system.

An example of a charge pump circuit is shown in FIG. 1, labeled prior art. A charge pump circuit includes a plurality of diode ladder stages in which complementary charge pump clock signals are provided to successive stages. The charge pump circuit operates by passing charge along the successive stages of the diode ladder using capacitive coupling of the complementary charge pump clock signals. The complementary charge pump clock signals are provided by the charge pump oscillator.

It is known to drive the charge pump circuit with a free-running delay line type of ring oscillator such as that depicted in FIG. 2, labeled prior art. The frequency of this type of oscillator is heavily dependent upon $V_{cc}$ because determines the actual delay of the components within the oscillation portion of the charge pump oscillator. The ring oscillator shown in FIG. 2 includes an oscillation portion and a clock driver portion. The oscillation portion provides an input signal to the clock driver portion at terminals "A" and "B".

The ring oscillator functions by connecting an odd number of inverter elements in a circular manner (i.e., in a ring). An input NAND gate provides a means for disabling the oscillator when the enable signal is low. The oscillator outputs are stable (PH1=1, PH2=0) when the enable signal is low. When enabled, the input NAND gate inverts the signal from terminal "A", which signal is then propagated through the inverters back to point "A", which is then fed back to the input NAND gate. The amount of time that it takes the signal to propagate back to point "A" is determined by the inverter delay. This inverter delay is dependent on $V_{cc}$ because $V_{cc}$ is the maximum gate-source voltage that can be applied to the transistors within each inverter stage. It is the gate-source voltage which determines the current drive of each inverter stage, which ultimately determines the propagation speed of each inverter stage. The signal which is present at point "A" is then provided to the clock driver portion which provides the PH1 signal. The signal which is present at point "B"0 is provided to the clock drive portion which provides the PH2 signal. The PH1 and PH2 signals are out of phase with each other.

In operation of a charge pump system, the final output voltage ($V_{out}$) of the charge pump circuit is dependent upon the starting voltage ($V_{in}$) provided to the charge pump circuit, clock voltage ($V_\phi$) of the charge pump clock signals, number of stages of the diode ladder (N), capacitor size of each stage's capacitor (C), parasitic capacitance to the substrate of the diode junctions (Cs), frequency of the charge pump clock signals (f), output current load ($I_{out}$) and diode threshold voltage ($V_D$). More specifically, the final output voltage of the charge pump system is set forth by Equation 1 as follows:

2

$$V_{out} = V_{in} + N\left[\frac{C}{C+Cs}V_\phi - V_D\right] - V_D - \frac{NI_{out}}{(C+Cs)f} \quad \text{Equation 1}$$

Equation 1 can be rearranged in terms of current output to provide Equation 2 as follows:

$$I_{out} = \frac{(C+Cs)f}{N}\left[V_{in} + N\left(\frac{C}{C+Cs}V_\phi - V_D\right) - V_D - V_{out}\right] \quad \text{Equation 2}$$

As can be seen from these equations, variations of the supply voltage affect the operation of the charge pump system in a number of ways. More specifically, a lower value for $V_{cc}$ causes the charge pump oscillator to generate a lower operating frequency output. Additionally, a lower value for $V_{cc}$ also translates into lower values for $V_{in}$ and $V_\phi$. Thus, the lower value of $V_{cc}$ causes the charge pump oscillator to generate a lower frequency charge pump clock signal which combines with the lower input voltage levels to make a relatively weak charge pump output voltage. Conversely, a higher value of $V_{cc}$ causes the charge pump oscillator to generate a higher frequency charge pump clock signal, which combines with the higher input voltage levels to provide a strong charge pump output voltage at higher $V_{cc}$ levels.

SUMMARY OF THE INVENTION

It has been discovered that providing an oscillator which generates a compensatory frequency over a wide range of supply voltages results in a charge pump that provides a consistent charge pump output voltage and current over a range of supply voltages.

More specifically, in one aspect, the invention relates to a charge pump oscillator apparatus for providing a charge pump clock signal having a charge pump clock signal frequency. The charge pump oscillator apparatus includes a reference circuit and a signal generation circuit. The reference circuit provides a reference signal when provided with a supply voltage; the reference signal is related to the supply voltage of the charge pump oscillator. The signal generation circuit receives the reference signal and provides the charge pump clock signal. The charge pump clock signal frequency is inversely related to the reference signal.

In another aspect, the invention relates to a charge pump system which includes a charge pump oscillator circuit and a charge pump circuit. The charge pump, oscillator circuit provides a charge pump clock signal which has a frequency which is inversely proportional to a supply voltage. The charge pump circuit is coupled to the charge pump oscillator circuit, receives the charge pump clock signal and provides a charge pump output signal based upon the frequency of the charge pump clock signal.

BRIEF DESCRIPTION OF THE DRAWINGS

FIG. 5 shows a timing diagram of the operation of the FIG. 4 charge pump oscillator.

DETAILED DESCRIPTION

The following sets forth a detailed description of the best contemplated mode for carrying out the invention. The description is intended to be illustrative of the invention and should not be taken to be limiting.

Figure 1:
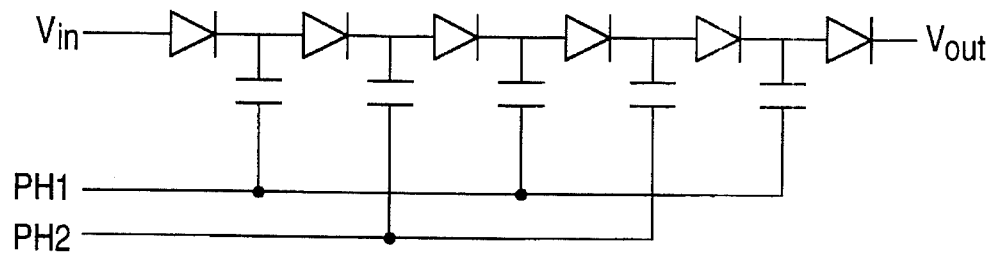
FIG. 1, labeled prior art, shows a schematic block diagram of a charge pump circuit.
Figure 2:
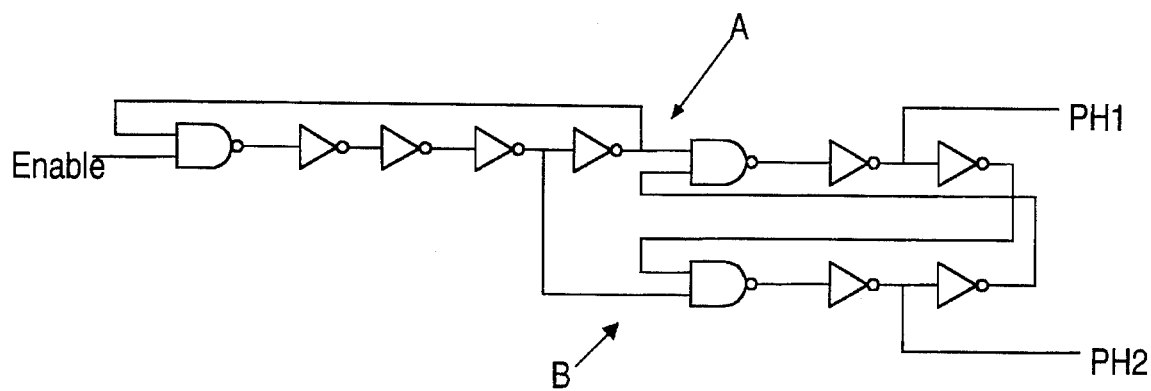
FIG. 2, labeled prior art, shows schematic block diagram of a free running delay line type of oscillator for use with a charge pump.
Figure 3:
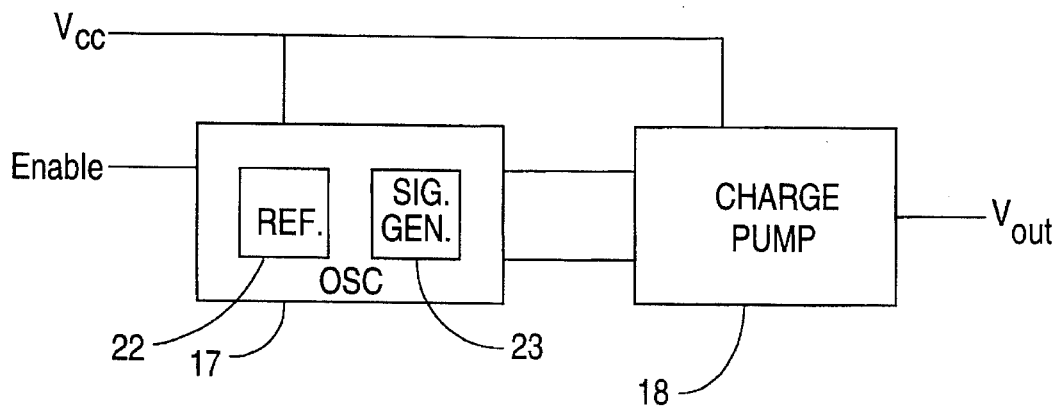
FIG. 3 shows a block diagram of a charge pump system in accordance with the present invention.

Referring to FIG. 3, a block diagram of charge pump system 16 is shown. Charge pump system 16 includes charge pump oscillator 17 and charge pump circuit 18. Charge pump oscillator 17 includes reference circuit 22 and signal generation circuit 23. Charge pump circuit 18, as is well known in the art, includes a plurality of successive diode ladder stages, each stage being coupled to complementary charge pump clock signals. Charge pump oscillator 17 provides a charge pump clock signal which has a frequency which, when provided to charge pump circuit 18, compensates for changes in the supply voltage.

Reference circuit 22 receives a supply voltage, $V_{cc}$, and provides a reference signal which is related to the supply voltage. Signal generation circuit 23 receives the reference signal and, when enabled by an enable signal, provides an oscillation signal whose frequency is inversely related to the reference signal. More specifically, a supply voltage causes a lower reference signal voltage, which in turn causes signal generation circuit 23 to generate an oscillation signal having a higher frequency. Alternately, a reference signal voltage which is higher causes signal generation circuit 23 to generate an oscillation signal having a lower frequency.

Figure 4:
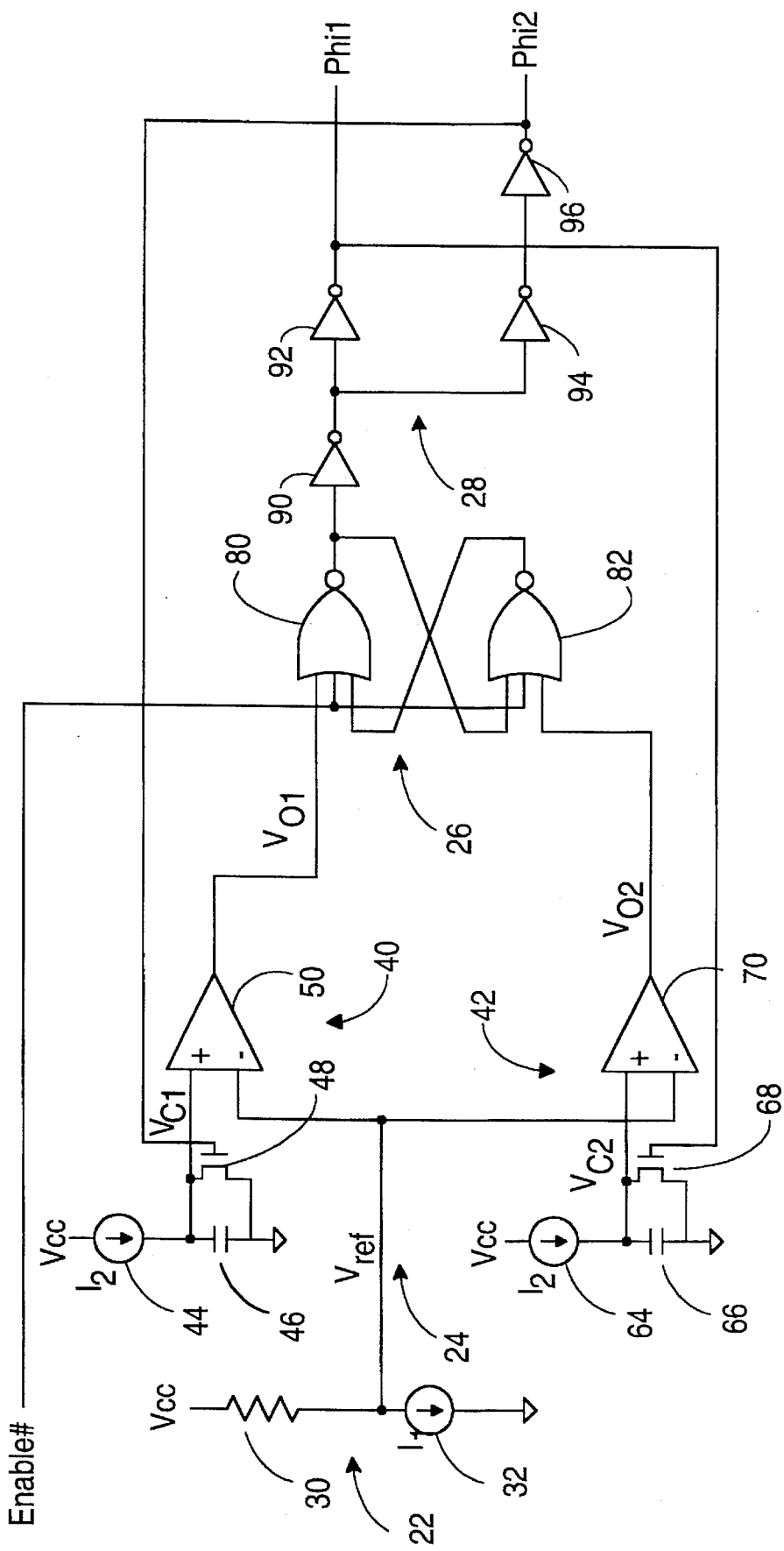
FIG. 4 shows a schematic block diagram of a charge pump oscillator for use in the FIG. 3 charge pump system.

Referring to FIG. 4, a schematic block diagram of charge pump oscillator 17 is shown. More specifically, oscillator 17 includes reference circuit 22, signal generation circuit 23 and driver circuit 28. Signal generation circuit 23 includes timing circuit 24 and latch circuit 26. Reference circuit 22 is coupled to timing circuit 24 which is coupled to latch circuit 26 which is in turn coupled to driver circuit 28. Additionally, driver circuit 28 is coupled to provide charge pump clock signals as feedback signals to timing circuit 24.

Reference circuit 22 includes resistor 30 and first current circuit 32. Current circuit 32 is, e.g., a current mirror, or other known constant current source. Reference circuit 22 provides a reference voltage, $V_{ref}$, to timing circuit 24. The reference voltage determines the charge pump clock signal frequency.

Timing circuit 24 includes first clock signal generator circuit 40 and second clock signal generator circuit 42. First clock signal generator circuit 40 and second clock signal generator circuit 42 determine the time that the respective charge pump clock signals Phi1 and Phi2 are high.

First signal generator circuit 40 includes current portion 44, capacitor 46, transistor 48 and operational amplifier 50. Current portion 44 is coupled between a source voltage, $V_{cc}$, and the top plate of capacitor 46. The bottom plate of capacitor 46 is coupled to ground. The source and drain terminals of transistor 48 are coupled across the two plates of capacitor 46. The gate terminal of transistor 46 is coupled to the Phi2 output of driver circuit 28, which provides a shunt signal. The output of current portion 44, the top plate of capacitor 46 and the source terminal of transistor 48 are all coupled to the non-inverting input of operational amplifier 50.

When Phi2 is high, shunt transistor 48 is in a conducting state thus causing the positive terminal of operational amplifier 50 to be at ground, which in turn causes the output of operational amplifier 50 to be low. When the Phi2 clock signal goes low, shunt transistor 48 is non-conducting. Thus allowing capacitor 46 to begin charging which causes the voltage on the top of capacitor 46 to begin rising. When this voltage, which is provided to the non-inverting input of operational amplifier 50 reaches $V_{ref}$, the output of operational amplifier 50 changes from low to high.

Second signal generator circuit 42 includes current portion 64, capacitor 66, transistor 68 and operational amplifier 70. Current portion 64 is coupled between the source voltage, $V_{cc}$, and the top plate of capacitor 66. The bottom plate of capacitor 66 is coupled to ground. The source and drain terminals of transistor 68 are coupled across the two plates of capacitor 66. The gate terminal of transistor 66 is coupled to the Phi1 output of driver circuit 28, which provides a shunt signal. The output of current portion 64, the top plate of capacitor 66 and the source terminal of transistor 68 are all coupled to the non-inverting input of operational amplifier 70.

Second signal generator circuit 42 operates in a manner similar to that described with reference to first signal generator circuit 40 above. However, transistor 68 of second clock signal generator circuit 42 is enabled by the Phi1 clock signal.

Latch circuit 26 holds the state of timing circuit 24. Latch circuit 26 is provided because at any given time, only one clock signal generator circuit 40, 42 is charging its respective capacitor. While one clock signal generator circuit 40, 42 is charging its respective capacitor, the other clock signal generator has its shunt transistor in a conducting state.

Latch circuit 26 includes NOR gate 80 and NOR gate 82. NOR gates 80 and 82 are arranged as a set/reset latch in which the output of signal generator 40 sets the latch and the output of signal generator 42 resets the latch. Additionally, each NOR gate 80, 82 receives an active low enable signal (ENABLE#) which enables the latch when active. The output of latch circuit 26 is the oscillator signal However, this oscillator signal is provided to driver circuit 28 to enhance the power of the signal for providing it to the charge pump.

Driver circuit 28 enhances the charge pump clock signal which is provided by latch circuit 26. Driver circuit 28 includes Phi1 inverter gates 90, 92 and Phi2 inverter gates 94, 96. Phi1 inverter gates 90, 92 receive the charge pump clock signal from latch circuit 26 and invert this signal twice, so that the charge pump clock signal is in it's original polarity, before providing the Phi1 clock signal to the charge pump. The Phi1 clock signal is also provided as a shunt signal to second signal generator circuit 42. Phi2 inverter gates 94, 96 receive a once inverted charge pump clock signal from inverter gate 90. Inverter gates 94, 96 invert this signal twice, so that the inverted charge pump clock signal is in an opposite polarity to the polarity of the Phi1 oscillator signal. The inverted charge pump clock signal is provided as the Phi2 charge pump clock signal. The Phi2 clock signal is also provided as a shunt signal to first signal generator circuit 40.

In operation, oscillator 17 regulates the oscillator frequency so that a charge pump delivers the same current output for a given output voltage across a wide range of supply voltages.

More specifically, simplifying Equation 2 and replacing $V_{in}$ and $V_\phi$ with $V_{cc}$, yields Equation 3:

$$I_{out} = \alpha f[Vcc - (\beta V_D + \delta V_{out})] \quad \text{Equation 3}$$

where

-continued
$$\alpha = \frac{Ce}{N},$$

$$\beta = \frac{(N+1)(C+Cs)}{Ce},$$

$$\delta = \frac{(C+Cs)}{Ce}, \text{ and}$$

$$Ce = (N+1)C + Cs$$

For a given charge pump design and fixed output voltage, all of the elements of Equation 3 are constant except $f$ and $V_{cc}$. Accordingly, to generate the same current across various $V_{cc}$, the pump frequency must be proportional to $$\frac{1}{V_{cc} - K} \qquad \text{Equation 4}$$

where $$K = \beta V_D + \delta V_{out} \qquad \text{Equation 5}$$

Accordingly, referring again to FIG. 3, the frequency of oscillation is a function of the time required for $V_{cc}$ to charge capacitors 46, 66 from 0 V to the reference voltage established by $V_{ref}$. This time is derived from $$I_2 = C\frac{dV_c}{dt} = C\frac{(V_{ref} - 0V)}{T} = C\frac{V_{cc} - I_1 R}{T} \qquad \text{Equation 6}$$

Because frequency is inversely proportional to T, Equation 6 may be rearranged and rewritten as $$f \propto \frac{1}{T} \propto \frac{1}{(V_{cc} - I_1 R)} \qquad \text{Equation 7}$$

By setting $I_1 R = K$, a charge pump system using an oscillator in accordance with the present invention delivers current nearly independent of $V_{cc}$. For example, for a charge pump which includes 14 stages, a capacitance value at each state of 2.7pF, a parasitic capacitance of approximately 0.2pF, an average diode threshold voltage across the pump of approximately 1.0 V and a desired output voltage of 15 V. Using these values, the output current (in µA) is expressed as a function of frequency (in MHz) and $V_{cc}$. More specifically, the output current is expressed in equation 8.

$$I_{out} = 2.9(V_{cc} - 2.14)f \qquad \text{Equation 8}$$

Referring to FIGS. 3 and 4, when the enable signal is not active (i.e., high), the outputs of NOR gates 80, 82 of latch circuit 26 are each low. Accordingly, the Phi1 oscillator signal is low and the Phi2 oscillator signal is high. $V_{c1}$ is pulled to ground through shunt transistor 48 causing $V_{o1}$ to be low. Transistor 68 is off, allowing $V_{c2}$ to charge up to $V_{cc}$ (which is $>V_{ref}$) causing $V_{o2}$ to be high.

When the enable signal becomes active (i.e., low), the output of NOR gate 80 switches high, causing Phi1 to go high and Phi2 to go low. When Phi1 goes high, it causes shunt transistor 68 to turn on, thus pulling $V_{c2}$ to ground. When Phi2 goes low, it causes shunt transistor 48 to turn off, thus allowing capacitor 46 to charge which causes the voltage $V_{c1}$ to increase. When the voltage $V_{c1}$ becomes greater than the reference voltage $V_{ref}$, the output of operational amplifier 50, $V_{o1}$, goes high, causing latch 26 to go low. When latch 26 goes low, Phi1 goes low and Phi2 goes high.

When Phi2 goes high, shunt transistor 48 turns on pulling $V_{c1}$ to ground. When $V_{c1}$ goes to ground, the voltage $V_{c1}$ is less than the reference voltage $V_{ref}$ and operational amplifier 50 goes low. Additionally, when Phi2 goes high, it causes shunt transistor 68 to turn off, thus allowing capacitor 66 to charge which causes the voltage $V_{c2}$ to increase. When the voltage $V_{c2}$ becomes greater than the reference voltage $V_{ref}$, the output of operational amplifier 70 goes high, causing latch 26 to reset and go high. When latch 26 goes high, Phi1 goes high and Phi2 goes low. Accordingly, the oscillator signals Phi1 and Phi2 oscillate until the enable signal again becomes inactive.

OTHER EMBODIMENTS

Other embodiments are within the following claims.

For example, while reference circuit 22 shows a reference voltage generated by a resistor and a current source, it will be appreciated that any circuit for generating a reference voltage is acceptable, such as diodes across which $V_{cc}$ is dropped.

Also for example, any circuit or combination of circuits which generate a sloped voltage signal is suitable for use as the timing generator circuits. For example, while the signal generator circuits are shown having capacitors, it will be appreciated that a transistor in which the gate and source terminals are coupled together provides a capacitance between these terminals and the drain of the capacitor.

Also for example, while latch circuit 26 is shown as a set/reset latch, it will be appreciated that any type of latch circuit is acceptable.

What is claimed is:

1. A charge pump oscillator apparatus for providing a charge pump clock signal having a charge pump clock signal frequency, the charge pump oscillator being provided with a supply voltage, the apparatus comprising a reference circuit, the reference circuit providing a reference signal when provided with the supply voltage, the reference signal being related to the supply voltage of the charge pump oscillator, and a signal generation circuit, the signal generation circuit receiving the reference signal and providing the charge pump clock signal, the charge pump clock signal frequency being inversely related to the reference signal, the signal generation circuit including a timing circuit coupled to the reference circuit, the timing circuit providing first and second timing signals based upon the reference signal, and a latch circuit coupled to the timing circuit, the latch circuit receiving the first and second timing signals and providing the charge pump clock signal based upon the first and second timing signals.

2. The charge pump oscillator apparatus of claim 1 wherein the timing circuit includes first and second timing generator circuits, the first and second timing generator circuits each receiving the reference signal and respectively generating the first and second timing signals based upon the reference signal.

3. The charge pump oscillator apparatus of claim 2 wherein the first timing generator circuit includes a current device, a capacitor coupled between the current device and ground, a shunt device coupled between the current device and ground, the shunt device causing the current provided by the current device to be driven to ground when the shunt device is turned on and allowing the current provided by the current device to charge the capacitor when the shunt device is turned off, the shunt device being controlled by a shunt signal.

4. The charge pump oscillator apparatus of claim 2 wherein the second timing generator circuit includes a current device, a capacitor coupled between the current device and ground, a shunt device coupled between the current device and ground, the shunt device causing the current provided by the current device to be driven to ground when the shunt device is turned on and allowing the current provided by the current device to charge the capacitor when the shunt device is turned off, the shunt device being controlled by a shunt signal.

5. The charge pump oscillator apparatus of claim 1 wherein the latch circuit includes a set reset latch, the set reset latch being set and reset by the first and second timing signals, respectively.

6. The charge pump oscillator apparatus of claim 1 further comprising a driver circuit coupled to the latch circuit, the driver circuit receiving the charge pump clock signal and providing the charge pump clock signal and an inverse charge pump clock signal as outputs.

7. The charge pump oscillator apparatus of claim 6 wherein the driver circuit includes an inverter, the inverter receiving the charge pump clock signal from the latch circuit and providing the inverse charge pump clock signal.

8. The charge pump oscillator apparatus of claim 6 wherein the charge pump clock signal and the inverse charge pump clock signal are provided to the timing circuit, and the first and second timing signals are generated based upon the charge pump clock signal and the inverse charge pump clock signal.

9. A charge pump oscillator apparatus for providing a charge pump clock signal having a charge pump clock signal frequency, the charge pump oscillator being provided with a supply voltage, the apparatus comprising a reference circuit, the reference circuit providing a reference signal when provided with the supply voltage, the reference signal being related to the supply voltage of the charge pump oscillator, the reference circuit including a resistor, and a current circuit coupled to the resistor, the resistor being coupled between a voltage source and the current circuit, the reference signal being provided as the voltage drop across the resistor based upon the current drawn by the current circuit; and a signal generation circuit, the signal generation circuit receiving the reference signal and providing the charge pump clock signal, the charge pump clock signal frequency being inversely related to the reference signal.

10. A charge pump system comprising a charge pump oscillator circuit, the charge pump oscillator circuit providing a charge pump clock signal, the charge pump clock signal having a frequency which is inversely proportional to a supply voltage, the charge pump oscillator circuit including a reference circuit, the reference circuit providing a reference signal when provided with the supply voltage, the reference signal being related to the supply voltage of the charge pump oscillator, and a signal generation circuit, the signal generation circuit receiving the reference signal and providing the charge pump clock signal, the charge pump clock signal frequency being inversely related to the reference signal, the signal generation circuit including a timing circuit coupled to the reference circuit, the timing circuit providing first and second timing signals based upon the reference signal, and a latch circuit coupled to the timing circuit, the latch circuit receiving the first and second timing signals and providing the charge pump clock signal based upon the first and second timing signals; and a charge pump circuit coupled to the charge pump oscillator circuit, the charge pump circuit receiving the charge pump clock signal and providing a charge pump output signal based upon the frequency of the charge pump clock signal.

11. The charge pump system of claim 10 wherein the timing circuit includes first and second timing generator circuits, the first and second timing generator circuits each receiving the reference signal and respectively generating the first and second timing signals based upon the reference signal.

12. The charge pump system of claim 11 wherein the first timing generator circuit includes a current device, a capacitor coupled between the current device and ground, a shunt device coupled between the current device and ground, the shunt device causing the current provided by the current device to be driven to ground when the shunt device is turned on and allowing the current provided by the current device to charge the capacitor when the shunt device is turned off, the shunt device being controlled by a shunt signal.

13. The charge pump system of claim 11 wherein the second timing generator circuit includes a current device, a capacitor coupled between the current device and ground, a shunt device coupled between the current device and ground, the shunt device causing the current provided by the current device to be driven to ground when the shunt device is turned on and allowing the current provided by the current device to charge the capacitor when the shunt device is turned off, the shunt device being controlled by a shunt signal.

14. The charge pump system of claim 10 wherein the latch circuit includes a set reset latch, the set reset latch being set and reset by the first and second timing signals, respectively.

15. The charge pump system of claim 10 further comprising a driver circuit coupled to the latch circuit, the driver circuit receiving the charge pump clock signal and providing the charge pump clock signal and an inverse charge pump clock signal as outputs.

16. The charge pump system of claim 15 wherein the driver circuit includes an inverter, the inverter receiving the charge pump clock signal from the latch circuit and providing the inverse charge pump clock signal.

17. The charge pump system of claim 15 wherein the charge pump clock signal and the inverse charge pump clock signal are provided to the timing circuit, and the first and second timing signals are generated based upon the charge pump clock signal and the inverse charge pump clock signal.

18. A charge pump system comprising a charge pump oscillator circuit, the charge pump oscillator circuit providing a charge pump clock signal, the charge pump clock signal having a frequency which is inversely proportional to a supply voltage, the charge pump oscillator circuit including
  a reference circuit, the reference circuit providing a reference signal when provided with the supply voltage, the reference signal being related to the supply voltage of the charge pump oscillator, the reference circuit including
    a resistor, and
    a current circuit coupled to the resistor,
      the resistor being coupled between a voltage source and the current circuit, the reference signal being provided as the voltage drop across the resistor based upon the current drawn by the current circuit; and
  a signal generation circuit, the signal generation circuit receiving the reference signal and providing the charge pump clock signal, the charge pump clock signal frequency being inversely related to the reference signal; and
a charge pump circuit coupled to the charge pump oscillator circuit, the charge pump circuit receiving the charge pump clock signal and providing a charge pump output signal based upon the frequency of the charge pump clock signal.

* * * * *

UNITED STATES PATENT AND TRADEMARK OFFICE
CERTIFICATE OF CORRECTION

PATENT NO. : 5,532,653
DATED : July 2, 1996
INVENTOR(S) : Kenneth C. Adkins It is certified that error appears in the above-identified patent and that said Letters Patent is hereby corrected as shown below:

```
Please substitute the previously issued Column 1, Line 29
before "determines" insert --Vcc--

Please substitute the previously issued Column 1, Line 53
Delete "0"
```

Signed and Sealed this

Eighteenth Day of March, 1997

*Attest:*

BRUCE LEHMAN

*Attesting Officer*     *Commissioner of Patents and Trademarks*